(12) United States Patent
Chung et al.

(10) Patent No.: US 6,987,407 B2
(45) Date of Patent: Jan. 17, 2006

(54) DELAY LOCKED LOOPS HAVING DELAY TIME COMPENSATION AND METHODS FOR COMPENSATING FOR DELAY TIME OF THE DELAY LOCKED LOOPS

(75) Inventors: Dae-hyun Chung, Daejeon (KR); Sang-woong Shin, Kyungki-do (KR); Woo-jin Lee, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/744,215

(22) Filed: Dec. 22, 2003

(65) Prior Publication Data

US 2004/0135605 A1 Jul. 15, 2004

(30) Foreign Application Priority Data

Dec. 30, 2002 (KR) .............................. 10-2002-0087240

(51) Int. Cl.
*H03L 7/06* (2006.01)

(52) U.S. Cl. ...................................... 327/158; 327/149
(58) Field of Classification Search ................ 327/149, 327/152–153, 158, 161
See application file for complete search history.

(56) References Cited

U.S. PATENT DOCUMENTS

| | | | |
|---|---|---|---|
| 6,275,079 B1 * | 8/2001 | Park ............................ 327/143 |
| 6,285,225 B1 * | 9/2001 | Chu et al. .................... 327/158 |
| 6,346,838 B1 * | 2/2002 | Hwang et al. ............... 327/156 |
| 6,522,182 B2 * | 2/2003 | Tomita et al. ............... 327/158 |
| 6,608,743 B1 * | 8/2003 | Suzuki ........................ 361/100 |
| 6,621,315 B2 * | 9/2003 | Heo et al. .................... 327/158 |
| 6,768,360 B2 * | 7/2004 | Tsuruki ....................... 327/158 |

\* cited by examiner

*Primary Examiner*—Timothy P. Callahan
*Assistant Examiner*—Cassandra Cox
(74) *Attorney, Agent, or Firm*—Myers Bigel Sibley & Sajovec

(57) ABSTRACT

A delay locked loop (DLL) is provided that includes a phase detector configured to detect a phase error between an internal clock signal and the external clock signal and output a phase error signal. A low pass filter is configured to output a predetermined control signal in response to the phase error signal. A variable delay circuit is configured to change a delay time in response to the predetermined control signal, delay the phase of the external clock signal with respect to the changed delay time, lock the delayed external clock signal and output the internal clock signal. A compensation delay circuit is configured to receive a control voltage based on a delay time introduced by a data output circuit and delay a phase of the internal clock signal for a first delay time based on the control voltage and output the delayed internal clock signal to the phase detector. Methods of compensating a delay for a DLL are also provided.

20 Claims, 7 Drawing Sheets ably not in the DLL 16, which,
DELAY LOCKED LOOPS HAVING DELAY TIME COMPENSATION AND METHODS FOR COMPENSATING FOR DELAY TIME OF THE DELAY LOCKED LOOPS

CLAIM OF PRIORITY

This application claims the priority from Korean Patent Application No. 2002-87240, filed on 30 Dec. 2002, in the Korean Intellectual Property Office, the disclosure of which is hereby incorporated by reference in its entirety as if fully set forth herein.

FIELD OF THE INVENTION

The present invention relates to a delay locked loops (DLL), and more particularly, to DLLs suitable for use in a memory device.

BACKGROUND OF THE INVENTION

In general, voltages supplied to a semiconductor memory device from outside a memory chip include a first external voltage VDD and a second external voltage VDDQ. FIG. 1 is a schematic block diagram of a conventional semiconductor memory device. As shown in FIG. 1, a semiconductor memory device 10 includes power pins 11 and 12, an internal voltage generator 13, a memory cell array 14, a peripheral circuit 15, and an output driver 17. The peripheral circuit 15 includes a delay locked loop (DLL) 16. The first external voltage VDD is supplied to the power pin 11, and the second external voltage VDDQ is supplied to the power pin 12.

The first external voltage VDD is supplied to the internal voltage generator 13 and the peripheral circuit 15 as a supply voltage. The internal voltage generator 13 generates an internal voltage by using the first external voltage VDD and supplies the generated internal voltage to the memory cell array 14 and the peripheral circuit 15. The second external voltage VDDQ is supplied to only the output driver 17.

Different supply voltages are provided to internal circuits of the semiconductor memory device 10 and the output driver 17 as discussed below with reference to FIG. 2. FIG. 2 shows a data input/output buffer of a conventional semiconductor memory device connected to a data input/output buffer of a controller on a printed circuit board (PCB). As shown in FIG. 2, an input/output buffer 21 of a memory chip 20 and an input/output buffer 41 of a controller chip 40 are connected with each other through a circuit pattern 31 on a printed circuit board (PCB) 30. The input/output buffer 21 includes an output driver 22 and an input receiver 23. The input/output buffer 41 includes an output driver 42 and an input receiver 43. Here, the output driver 22 has an output load including the resistance of the circuit pattern 31 on the PCB 30, a gate capacitance of the input receiver 43, and a junction capacitance of the output driver 42. Since the output load outside the memory chip 20 is greater than the load inside the memory chip 20, power consumption of the output driver 22 increases.

When voltage levels of a plurality of output data change at the same time, a simultaneous switching output (SSO) noise is generated due to a parasitic inductance of the power pin 12 of FIG. 1, which may cause a change in the level of the second external voltage VDDQ. Since the second external voltage VDDQ may include a large amount of noise, it is preferable that the second external voltage VDDQ is not used in the peripheral circuit 15 of the semiconductor memory device 10, particularly not in the DLL 16, which, typically, requires a very fine operation. Thus, different supply voltages are applied to the peripheral circuit 15 of the semiconductor memory device 10 and the output driver 17.

There have been increasing efforts to decrease the level of the second external voltage VDDQ, thereby reducing power consumption. The power consumption can also be reduced by decreasing the levels of both the second external voltage VDDQ and the first external voltage VDD. However, since the operating speed of the memory chip 20 is affected by the first external voltage VDD, it is desirable that only the level of the second external voltage VDDQ is reduced.

As seen in FIG. 1, The second external voltage VDDQ is used for the output driver 17 to output data. Because a circuit which does not perform full-swing, such as a stub series terminated transceiver logic (SSTL) interface which includes a termination for impedance matching, does not typically affect the operating characteristic of a memory chip, it is possible to decrease the level of the second external voltage VDDQ provided to the circuit.

In an I/O interface method where data is transmitted in synchronization with a clock signal frequency, such as in data transmission between a semiconductor memory device and a memory controller, as the load on a bus and a transmission frequency are increased it may be important for data to be accurately synchronized with a clock signal. Thus, the DLL circuit may be used to remove skew between an external clock signal and data output.

FIG. 3 is a block diagram showing a conventional DLL and output driver of a semiconductor memory device. As shown in FIG. 3, a DLL 50 according to the prior art includes an external clock signal input buffer 51, a phase detector 52, a low pass filter 53, a variable delay circuit 54, and a compensation delay circuit 55. The output driver 22 receives an internal clock signal from the DLL 50 through an internal clock signal buffer 24. The external clock signal input buffer 51 receives an external clock signal CLK_EX, and the phase detector 52 compares the phase of the external clock signal CLK_EX with the phase of an internal clock signal CLK2 and detects a phase error.

The low pass filter 53 controls a delay time of the variable delay circuit 54 by generating a control signal based on information on the phase error. The variable delay circuit 54 generates an internal clock signal CLK1 by delaying the external clock signal CLK_EX for a variable delay time in response to the control signal and locking the delayed external clock signal CLK_EX. The compensation delay circuit 55 delays the internal clock signal CLK1 for an output delay time tSAC and outputs the internal clock signal CLK2. The internal clock signal CLK2 is inputted to the phase detector 52 and is compared with the phase of the external clock signal CLK_EX.

The first external voltage VDD is supplied to the compensation delay circuit 55, and the second external voltage VDDQ is supplied to the output driver 22. The data output delay time tSAC is a time required to output data from the memory cell array 14 of FIG. 1 to outside the memory chip 20 through the output driver 22. In FIG. 3, "d1" denotes a delay time introduced by the external clock signal input buffer 51, and tCC−(d1+tSAC) denotes a delay time introduced by the variable delay circuit 54. Here, "tCC" denotes a period of the external clock signal CLK_EX.

In order to accurately detect a phase error between the external clock signal and the internal clock signal, the internal clock signal CLK1 is, typically, compensated for by the data output delay time tSAC. However, characteristics of the semiconductor memory device change with respect to changes in a manufacturing process, voltage, and temperature. The phase error due to changes in the characteristics of the semiconductor memory device is detected by the phase detector 52, and the delay time introduced by the variable delay circuit 54 may change accordingly. It is, typically, important for the delay time introduced by the variable delay circuit 54 to be accurately changed so as to generate an internal clock signal whose delay time is controlled based on the phase error due to the changes in the characteristics of the semiconductor memory device. However, it is also important for the data output delay time tSAC introduced by the compensation delay circuit 55 to be accurately compensated for.

In order to accurately compensate for the data output delay time tSAC, the compensation delay circuit 55 should be configured to introduce the same delay time as a delay time introduced by a real data path. However, it is very difficult to do this in practice. This is because the output driver 22 must be large so as to drive large loads outside the memory chip. Moreover, such large loads, typically, cannot be implemented inside the memory chip. In addition, in order to configure the compensation delay circuit 55 to have the same delay time as the delay time introduced by the output driver 22, it may be necessary to use the second external voltage VDDQ in the compensation delay circuit 55. However, since the second external voltage VDDQ may include a large amount of noise, it may have a detrimental influence on the operation of the DLL 50. Furthermore, if the compensation delay circuit 55 uses the second external voltage VDDQ as the operating voltage, a voltage level shifter may additionally be required for the DLL 50 using the first external voltage VDD. Therefore, it may be ineffective to use the second external voltage VDDQ in the compensation delay circuit 55. In addition, with respect to layout, because the second external voltage VDDQ is used only in the output driver 22, it may be necessary to form a pattern in another circuit layer.

FIG. 4 is a circuit diagram of the compensation delay circuit 55 of FIG. 3. The compensation delay circuit 55 of FIG. 4 uses only the first external voltage VDD as a power source. As shown in FIG. 4, the compensation delay circuit 55 includes a plurality of inverter circuits 61, 62, 63, and 64 that are consecutively connected with one another. The inverter circuits 61, 62, 63, and 64 are CMOS inverter circuits including PMOS transistors P1, P2, P3, and P4, and NMOS transistors N1, N2, N3, and N4.

The first external voltage VDD is supplied to the inverter circuits 61, 62, 63, and 64 as a supply voltage, and the internal clock signal CLK1 is inputted to the gates of the PMOS transistor P1 and the NMOS transistor N1. A delayed internal clock signal CLK2 is outputted from the drains of the PMOS transistor P4 and the NMOS transistor N4.

If information regarding changes of the second external voltage VDDQ is not reflected in the compensation delay circuit 55, it may not be possible to accurately compensate for the data output delay time tSAC when a potential difference occurs between the first external voltage VDD and the second external voltage VDDQ. More specifically, for example, both the first external voltage VDD and the second external voltage VDDQ may be 2.5V, and then only the second external voltage VDDQ may change to 2.7V the moment after the DLL 50 has completed locking. As the second external voltage VDDQ increases, the data output speed of the output driver 22 also increases. Thus, the data output delay time tSAC is reduced. However, since only the first external voltage VDD is supplied to the compensation delay circuit 55 of 2.5V, the delay time introduced by the compensation delay circuit 55 is longer than the data output delay time tSAC.

In contrast to the above, both the first external voltage VDD and the second external voltage VDDQ may be 2.5V, and then only the second external voltage VDDQ may change to 2.3V the moment after the DLL 50 has completed locking. In this case, the data output speed of the output driver 22 decreases, and thus the data output delay time tSAC is increased. However, since only the first external voltage VDD is supplied to the compensation delay circuit 55, a delay time introduced by the compensation delay circuit 55 is shorter than the data output delay time tSAC.

SUMMARY OF THE INVENTION

Embodiments of the present invention provide a delay locked loop (DLL) that includes a phase detector, a low pass filter, a variable delay circuit and a compensation delay circuit. The phase detector is configured to detect a phase error between an internal clock signal and the external clock signal and output a phase error signal. The low pass filter is configured to output a predetermined control signal in response to the phase error signal. The variable delay circuit is configured to change a delay time in response to the predetermined control signal, delay the phase of the external clock signal with respect to the changed delay time, lock the delayed external clock signal and output the internal clock signal. The compensation delay circuit is configured to receive a control voltage based on a delay time introduced by a data output circuit and delay a phase of the internal clock signal for a first delay time based on the control voltage and output the delayed internal clock signal to the phase detector.

In further embodiments of the present invention, the control voltage is a supply voltage for an output driver of a data input/output buffer and the compensation delay circuit includes a plurality of delay circuits having delay times controlled in response to the control voltage. Each of the delay circuits may include an inverter circuit configured to delay the phase of the internal clock signal for a second delay time and a pull-down circuit which is connected to the inverter circuit and configured to control a delay time of the inverter circuit in response to the control voltage. The supply voltage of the inverter circuit may be supplied to an internal voltage generator and a peripheral circuit as a supply voltage.

In additional embodiments of the present invention, the pull-down circuit controls the delay time by changing the current capacity of the inverter circuit. The pull-down circuit may include an NMOS transistor.

In still further embodiments of the present invention, the compensation delay circuit further includes a plurality of capacitance circuits that are connected between the plurality of delay circuits and that delay the phase of the internal clock signal outputted from the plurality of delay circuits for a third delay time. Each of the capacitance circuits may include a PMOS transistor and an NMOS transistor.

In yet other embodiments of the present invention, the compensation delay circuit includes a bias circuit configured to generate a bias voltage in response to the control voltage and a plurality of delay circuits configured to control delay times in response to the bias voltage. The bias circuit may include PMOS transistors that use the supply voltage used for an internal voltage generator of a memory device and a peripheral circuit of the memory device as a supply voltage and generate a first bias voltage, a first NMOS transistor that uses the control voltage as a bias voltage and a second NMOS transistor that generates a second bias voltage. The control voltage may be a supply voltage for an output driver of a data input/output buffer.

In additional embodiments of the present invention, the levels of the first bias voltage and the second bias voltage are changed with respect to a change in the level of the control voltage. The levels of the first bias voltage and the second bias voltage may be changed in inverse proportion to each other.

In still further embodiments of the present invention, the plurality of delay circuits include an inverter circuit that delays the phase of the internal clock signal for a predetermined time, a pull-Lip circuit that controls the delay time of the inverter circuit in response to the first bias voltage and a pull-down circuit that controls the delay time of the inverter circuit in response to the second bias voltage. The pull-up circuit and the pull-down circuit may be configured to change current capacity of the inverter circuit to control the delay time. The pull-up circuit may include a PMOS transistor, and the pull-down circuit may include an NMOS transistor.

In other embodiments of the present invention, a delay time introduced by a data output circuit is compensated for in a delay locked loop (DLL) that includes a compensation delay circuit controlling the delay time by compensating the delay time using a control voltage that is based on the delay time of the data output circuit. For example, a control voltage may be generated based on a supply voltage of an output driver of the data output circuit to control the compensation delay circuit to control the delay time. The delay time may be increased if the supply voltage decreases and decreased if the supply voltage increases.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which embodiments of the invention are shown. This invention may, however, be embodied in many different forms and should not be construed as being limited to the embodiments set forth herein. Rather, these embodiments are provided so that this disclosure will be thorough and complete, and will fully convey the concept of the invention to those skilled in the art. Unless indicated otherwise, like numbers refer to like elements.

Figure 5:
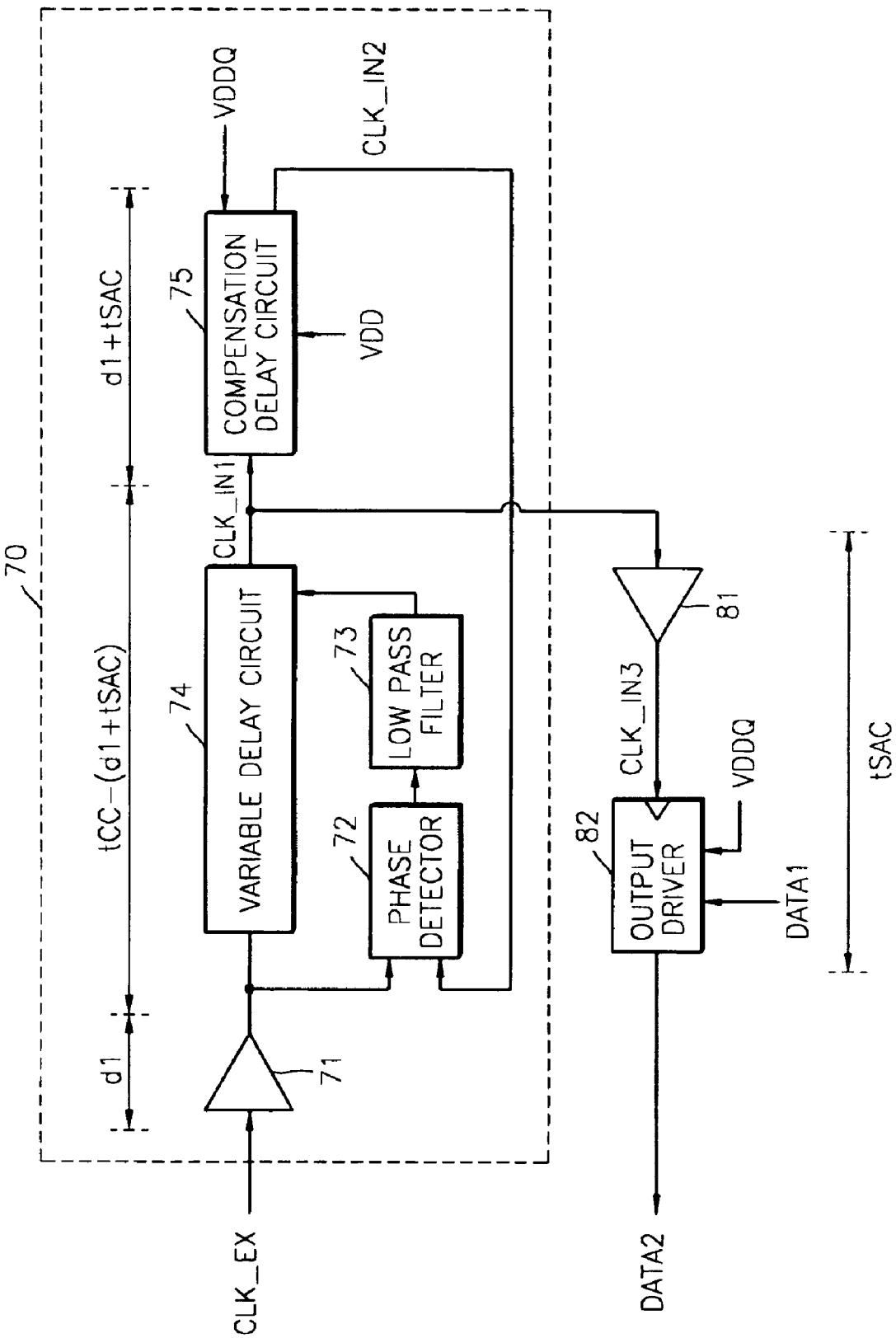
FIG. 5 is a block diagram of a delay locked loop (DLL) and an output driver of a semiconductor memory device according to embodiments of the present invention.

FIG. 5 is a block diagram of a delay locked loop (DLL) and an output driver of a semiconductor memory device having a compensation delay circuit according to embodiments of the present invention. The DLL and output driver of FIG. 5 may replace the DLL 16 and output driver 17 in a memory device of FIG. 1 to provide memory devices according to embodiments of the present invention. As shown in FIG. 5, a DLL 70 according to embodiments of the present invention includes an external clock signal buffer 71, a phase detector 72, a low pass filter 73, a variable delay circuit 74, and a compensation delay circuit 75. An output driver 82 receives an internal cock signal CLK_IN3 from the DLL 70 through an internal clock signal buffer 81. The external clock signal buffer 71 receives an external clock signal CLK_EX, and the phase detector 72 compares the phase of the external clock signal CLK_EX with the phase of an internal clock signal CLK_IN2 and detects a phase error therebetween.

The low pass filter 73 controls a delay time introduced by the variable delay circuit 74 by generating a control signal based on information on the phase error. The variable delay circuit 74 delays generates an internal clock signal CLK_IN1 by delaying the external clock signal CLK_EX for the controlled delay time in response to the control signal and locking the delayed external clock signal CLK_EX.

The compensation delay circuit 75 outputs the internal clock signal CLK_IN2 by delaying the internal clock signal CLK_IN1 for a data output delay time tSAC. The internal clock signal CLK_IN2 is inputted to the phase detector 72 and is compared to the phase of the external clock signal CLK_EX. As is further illustrated in FIG. 5, both a first external voltage VDD and a second external voltage VDDQ are supplied to the compensation delay circuit 75, and only the second external voltage VDDQ is supplied to the output driver 82.

Figure 1:
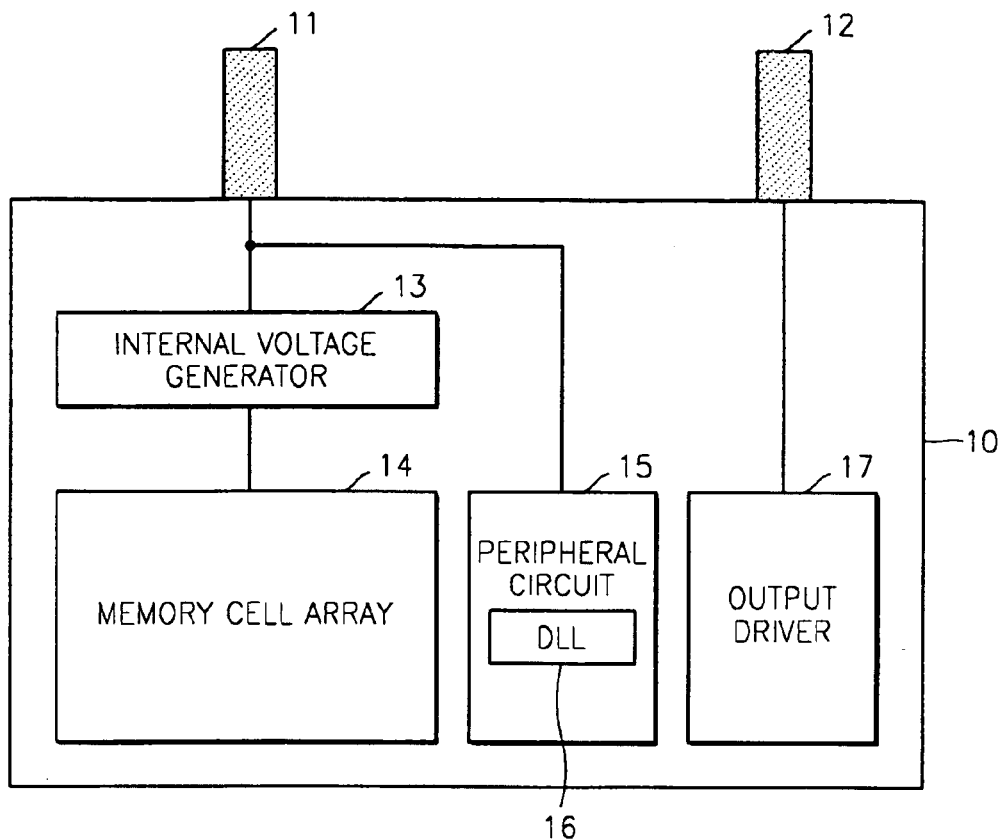
FIG. 1 is a schematic block diagram of a conventional semiconductor memory device.
Figure 2:
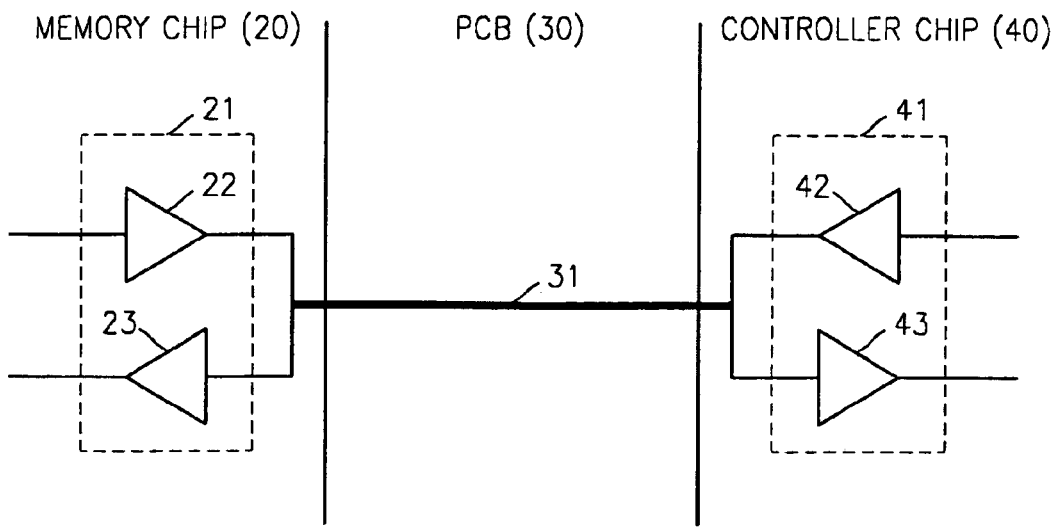
FIG. 2 shows a data input/output buffer of a conventional semiconductor memory device connected to a data input/output buffer of a controller on a printed circuit board (PCB)
Figure 3:
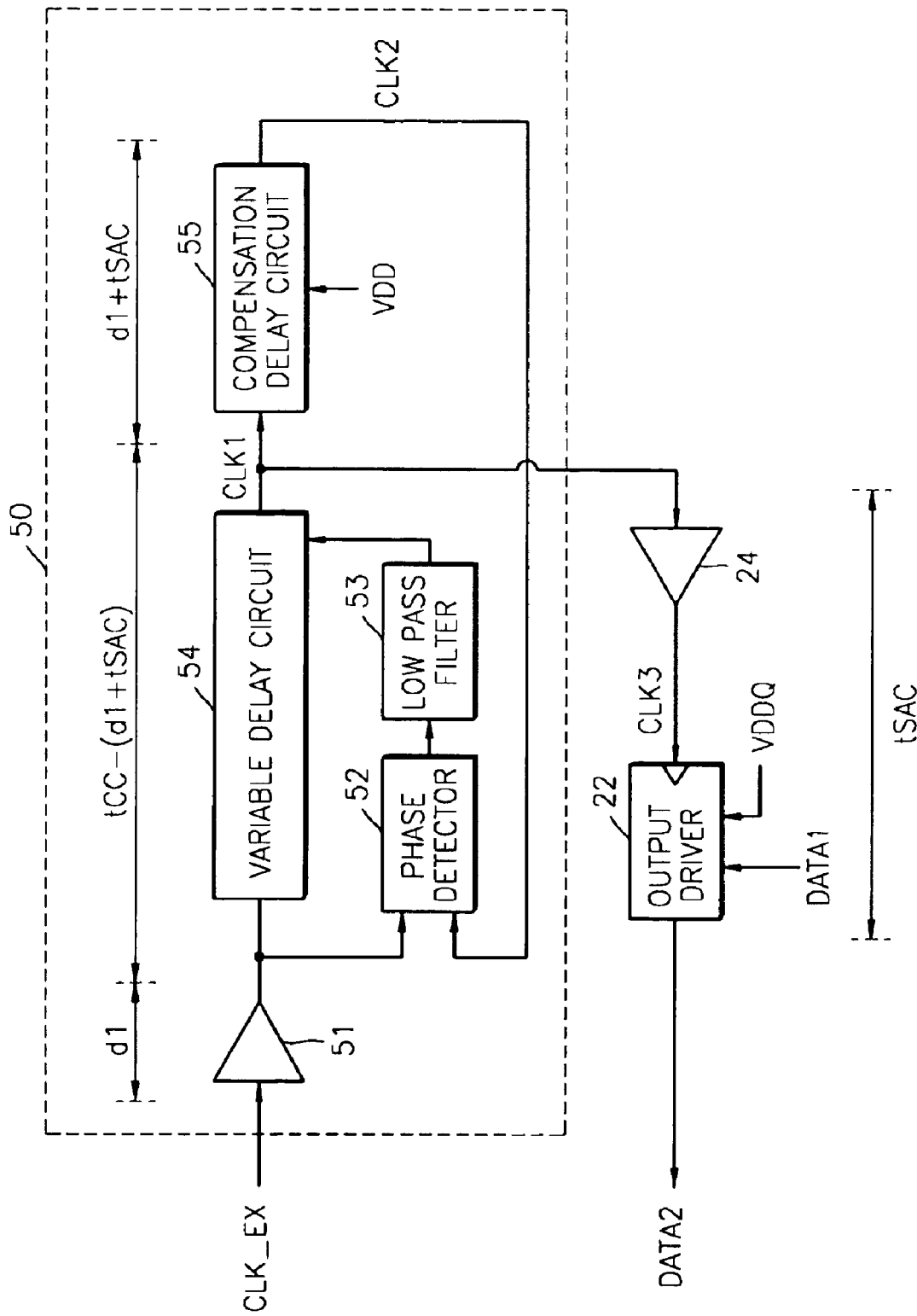
FIG. 3 is a block diagram of a delay locked loop (DLL) and an output driver of a conventional semiconductor memory device.
Figure 4:
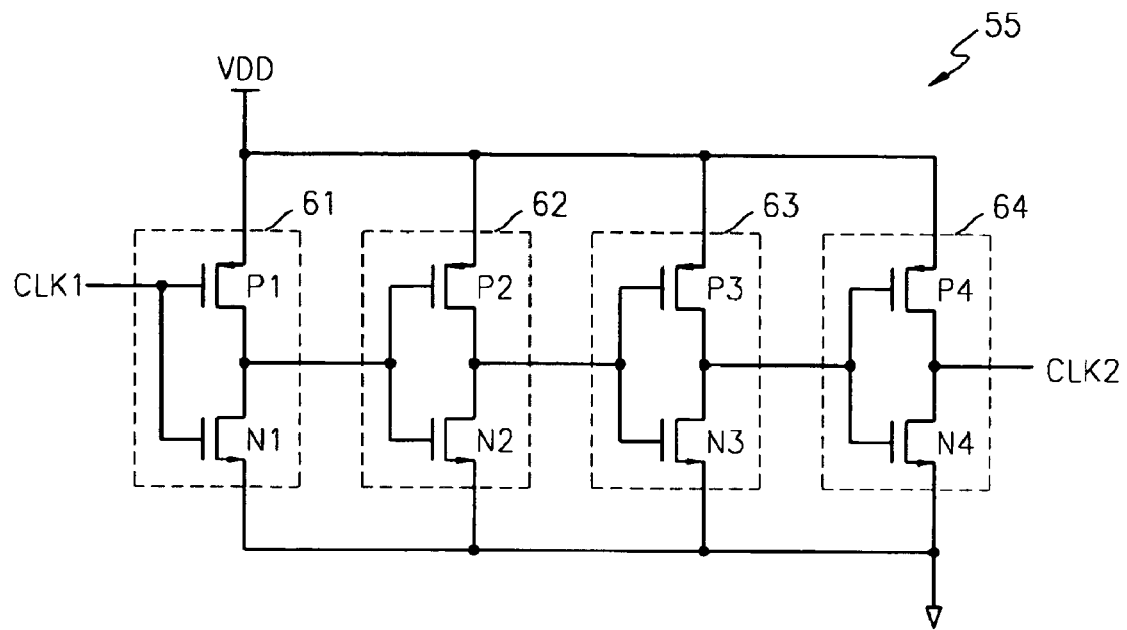
FIG. 4 is a circuit diagram of a conventional compensation delay circuit of FIG. 3.

The data output delay time tSAC is a time required to output data from the memory cell array 14 of FIG. 1 to outside a memory chip through the output driver 82. In FIG. 5, "d1" denotes a delay time introduced by the external clock signal input buffer 71, and tCC−(d1+tSAC) is a delay time introduced by the variable delay circuit 74. Here, "tCC" denotes a period of the external clock signal CLK_EX.

The operation of the DLL 70 will now be described. The phase detector 72 compares the phase of the external clock signal CLK_EX with a phase of the internal clock signal CLK_IN2 delayed by the compensation delay circuit 75 and detects a phase error. The low pass filter 73 controls the delay time of the variable delay circuit 74 by outputting the control signal based on the information on the phase error. The variable delay circuit 74 delays the external clock signal CLK_EX received by the external clock signal buffer 71 for the controlled delay time and locks the delayed external clock signal CLK_EX. The delayed and locked signal is then outputted as the internal clock signal CLK_IN1.

The internal clock signal buffer 81 receives the internal clock signal CLK_IN1, buffers it, and supplies the buffered internal clock signal CLK_IN3 to the output driver 82. The output driver 82 synchronizes data DATA1 outputted from a memory cell array with the internal clock signal CLK_IN3 and outputs the synchronized data DATA1 as data DATA2 to outside the memory chip.

The compensation delay circuit 75 delays the internal clock signal CLK_IN1 for the data output delay time tSAC and outputs the delayed internal clock signal CLK_IN2. The second external voltage VDDQ is supplied to the compensation delay circuit 75 as a bias voltage, and the delay time introduced by the compensation delay circuit 75 changes as the level of the second external voltage VDDQ changes.

Figure 6:
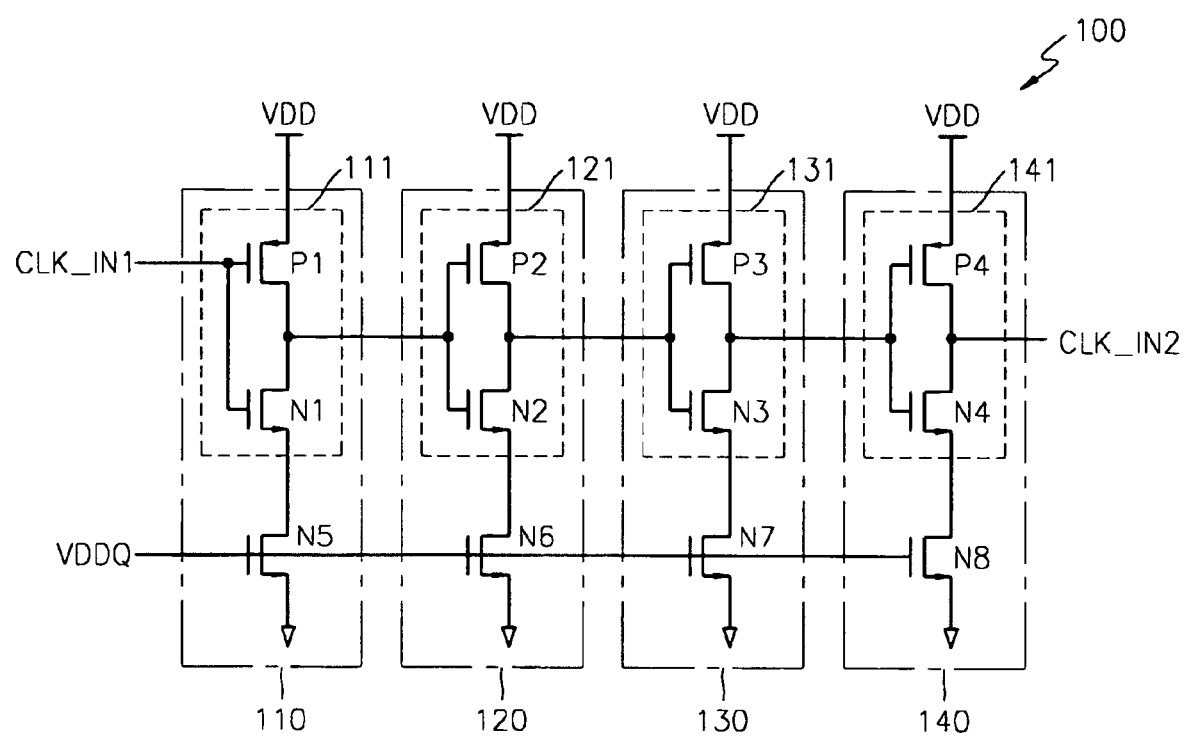
FIG. 6 is a schematic illustration of a compensation delay circuit according to embodiments of the present invention.

FIG. 6 is a schematic illustration of a compensation delay circuit 100 according to certain embodiments of the present invention. As shown in FIG. 6, the compensation delay circuit 100 includes a plurality of delay circuits 110, 120, 130 and 140 connected in series. In FIG. 6, four delay circuits are connected in series. However, the number of delay circuits may vary with respect to a target delay time of the compensation delay circuit. The delay circuits 110, 120, 130 and 140 include inverter circuits 111, 121, 131 and 141, respectively, and pull-down circuits N5, N6, N7 and N8, respectively. The inverter circuits 111, 121, 131 and 141 include PMOS transistors P1, P2, P3 and P4, respectively, and NMOS transistors N1, N2, N3 and N4, respectively.

The first external voltage VDD is supplied to the inverter circuits 111, 121, 131 and 141 as a supply voltage, and the internal clock signal CLK_IN1 is inputted to the gates of the PMOS transistor P1 and the NMOS transistor N1. The internal clock signal CLK_N2 is outputted from the drains of the PMOS transistor P4 and the NMOS transistor N4.

The pull-down circuits N5, N6, N7 and N8 may be NMOS transistors, and drains of the NMOS transistors N5, N6, N7 and N8 are connected to the sources of the NMOS transistors N1, N2, N3 and N4, respectively. The second external voltage VDDQ is inputted to the gates of the NMOS transistors N5, N6, N7 and N8 as a bias voltage. The sources of the NMOS transistors N5, N6, N7 and N8 are connected to a ground voltage.

As described above, if the second external voltage VDDQ is used as a bias voltage, the efficiency of the layout of the memory chip can be enhanced compared to a case where the second external voltage VDDQ is used as a supply voltage. In addition, the second external voltage VDDQ can be used as a bias voltage by connecting a metal line having a small width such as a signal line to the compensation delay circuit 100. Thus, even if the second external voltage VDDQ contains a large amount of noise, it may have little influence on other circuits related to the DLL. In addition, because the metal line connected to the second external voltage VDDQ has a large RC time constant, it may serve as a low pass filter. Thus, noise having a high frequency can be removed from the second external voltage VDDQ inputted to the compensation delay circuit 100.

The operation of the compensation delay circuit 100 will now be described. When the internal clock signal CLK_IN1 is inputted to the compensation delay circuit 100, the inverter circuits 111, 121, 131 and 141 delay the internal clock signal CLK_IN1 for a predetermined time and output the internal clock signal CLK_IN2. The size of the turn-on resistance of the NMOS transistors N5, N6, N7 and N8 changes as the level of the second external voltage VDDQ changes. As a result, the current capacity of the inverter circuits 111, 121, 131 and 141 is changed, which causes changes in the delay times introduced by the inverter circuits 111, 121, 131 and 141.

More specifically, when the second external voltage VDDQ increases, the current capacity of the inverter circuits 111, 121, 131 and 141 also increase. Thus, the delay times introduced by the inverter circuits 111, 121, 131 and 141 are reduced. When the second external voltage VDDQ decreases, current capacity of the inverter circuits 111, 121, 131 and 141 are also decreased. Thus, the delay times introduced by the inverter circuits 111, 121, 131 and 141 are increased. As described above, because the delay time of the compensation delay circuit 100 changes with respect to the change in the level of the second external voltage VDDQ, the data output delay time tSAC can be accurately compensated.

Figure 7:
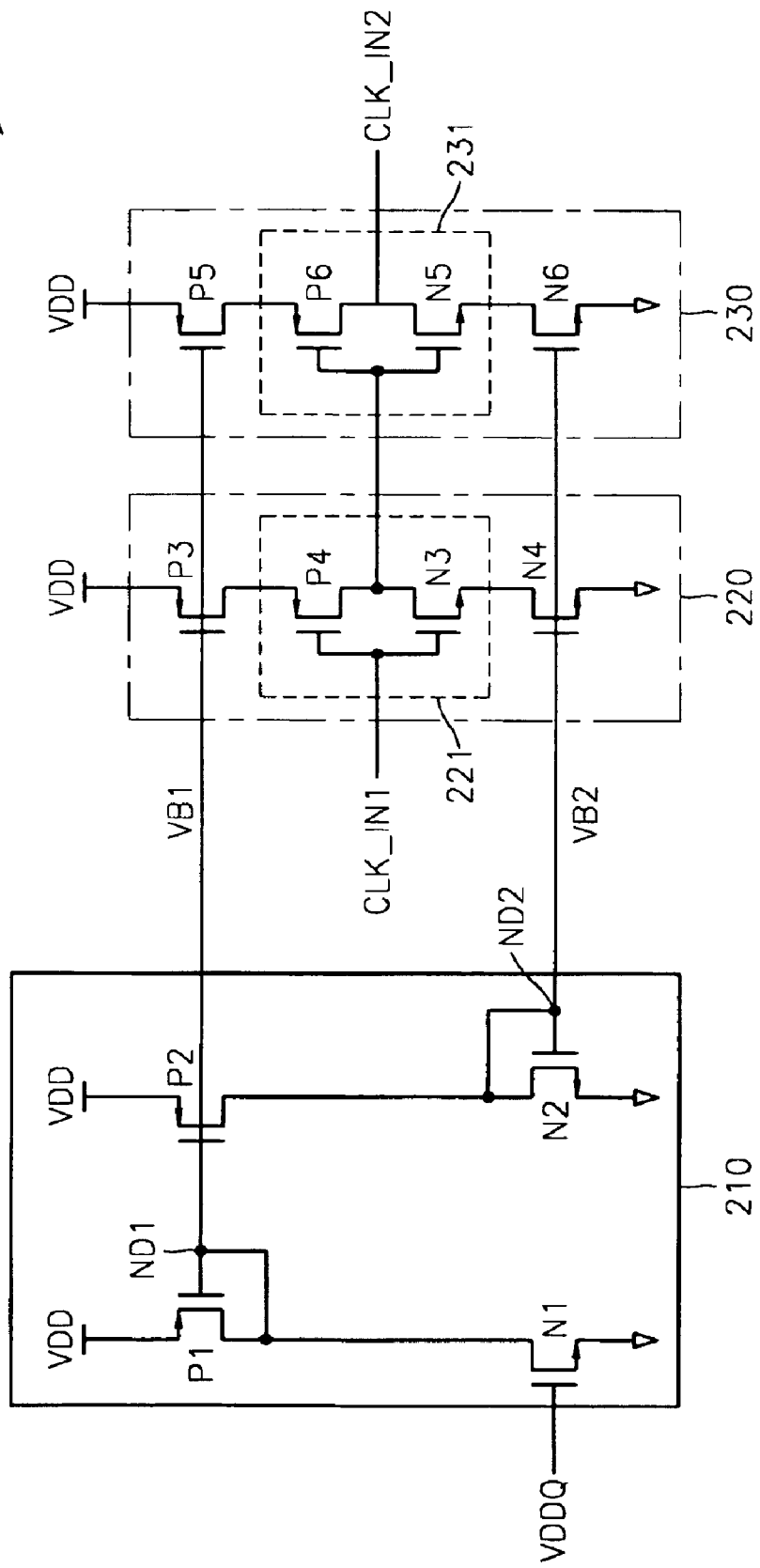
FIG. 7 is a schematic illustration of a compensation delay circuit according to further embodiments of the present invention.

As shown in FIG. 7, a bias circuit can be added so as to more finely control a compensation delay circuit 200. FIG. 7 is a schematic of a compensation delay circuit according to further embodiments of the present invention. As shown in FIG. 7, the compensation delay circuit 200 includes a bias circuit 210 and delay circuits 220 and 230 connected in series. In FIG. 7, two delay circuits are shown. However, the number of delay circuits may vary with respect to a target delay time of the compensation delay circuit.

The bias circuit 210 includes PMOS transistors P1 and P2 and NMOS transistors N1 and N2. The first external voltage VDD is supplied to the bias circuit 210 as a supply voltage. The sources of the PMOS transistors P1 and P2 are connected to the first external voltage VDD, and the gates of the PMOS transistors P1 and P2 are connected to a first node ND1. The gate of the PMOS transistor P1 and the drain of the PMOS transistor P1 are connected to each other. The drains of the NMOS transistors N1 and N2 are connected to the drains of the PMOS transistors P1 and P2. The gate of the NMOS transistor N2 and the drain of the NMOS transistor N2 are connected with each other to provide a second node ND2. The second external voltage VDDQ is inputted to the gate of the NMOS transistor N1. A first bias voltage VB1 is outputted from the first node ND1 and a second bias voltage VB2 is outputted from the second node ND2.

The delay circuits 220 and 230 include inverter circuits 221 and 231, pull-up circuits P3 and P5, and pull-down circuits N4 and N6. The inverter circuits 221 and 231 include PMOS transistors P4 and P6 and NMOS transistors N3 and N5.

The First external voltage VDD is supplied to the inverter circuits 221 and 231 as a supply voltage, and the internal clock signal CLK_IN1 is inputted to the gates of the PMOS transistor P4 and the NMOS transistor N3. The internal clock signal CLK_IN1 is delayed and outputted from the drains of the PMOS transistor P6 and the NMOS transistor N5 as the delayed internal clock signal CLK_IN2.

The pull-Lip circuits P3 and P5 may be PMOS transistors. The first external voltage VDD is supplied to the sources of the PMOS transistors P3 and P5. The first bias voltage VB1 is supplied to the gates of the PMOS transistors P3 and P5. The drains of the PMOS transistors P3 and P5 are connected to the sources of the PMOS transistors P4 and P6.

The pull-down circuits N4 and N6 may be NMOS transistors. The drains of the NMOS transistors N4 and N6 are connected to sources of the NMOS transistors N3 and N5. The second bias voltage VB2 is supplied to gates of the NMOS transistors N4 and N6.

The operation of the compensation delay circuit 200 according to embodiments of the present invention will now be described. When the internal clock signal CLK_IN1 is inputted, the inverter circuits 221 and 231 delay the delayed internal clock signal CLK_IN1 for a predetermined time and output the internal clock signal CLK_IN2. The bias circuit 210 changes the levels of the first bias voltage VB1 and the second bias voltage VB2 with respect to a change in the level of the second external voltage VDDQ. As the levels of the first bias voltage VB1 and the second bias voltage VB2 change, the sizes of the turn-on resistances of the PMOS transistors P3 and P5 acting as pull-up circuits and the NMOS transistors N4 and N6 acting as pull-down circuits are changed. As a result, the current capacity of the inverter circuits 221 and 231 change, which causes changes in the delay times introduced by the inverter circuits 221 and 231.

More specifically, when the second external voltage VDDQ increases, the level of the first bias voltage VB1 outputted from the bias circuit 210 decreases whereas the level of the second bias voltage VB2 increases. As the level of the first bias voltage VB1 decreases, the size of the turn-on resistance of the PMOS transistors P3 and P5 is reduced. As the level of the second bias voltage VB2 increases, the size of the turn-on resistance of the NMOS transistors N4 and N6 is reduced. As a result, the current capacity of the inverter circuits 221 and 231 increases. Thus, the delay times introduced by the inverter circuits 221 and 231 are reduced. When the second external voltage VDDQ decreases, the bias circuit 210, the pull-up circuits P3 and P5 and the pull-down circuits N4 and N6 operate inversely to when the second external voltage VDDQ increases, and thus the delay times introduced by the inverter circuits 221 and 231 are increased.

As described above, since the delay time of the compensation delay circuit 200 changes with respect to changes in the level of the second external voltage VDDQ, the data output delay time tSAC can be accurately compensated.

Figure 8:
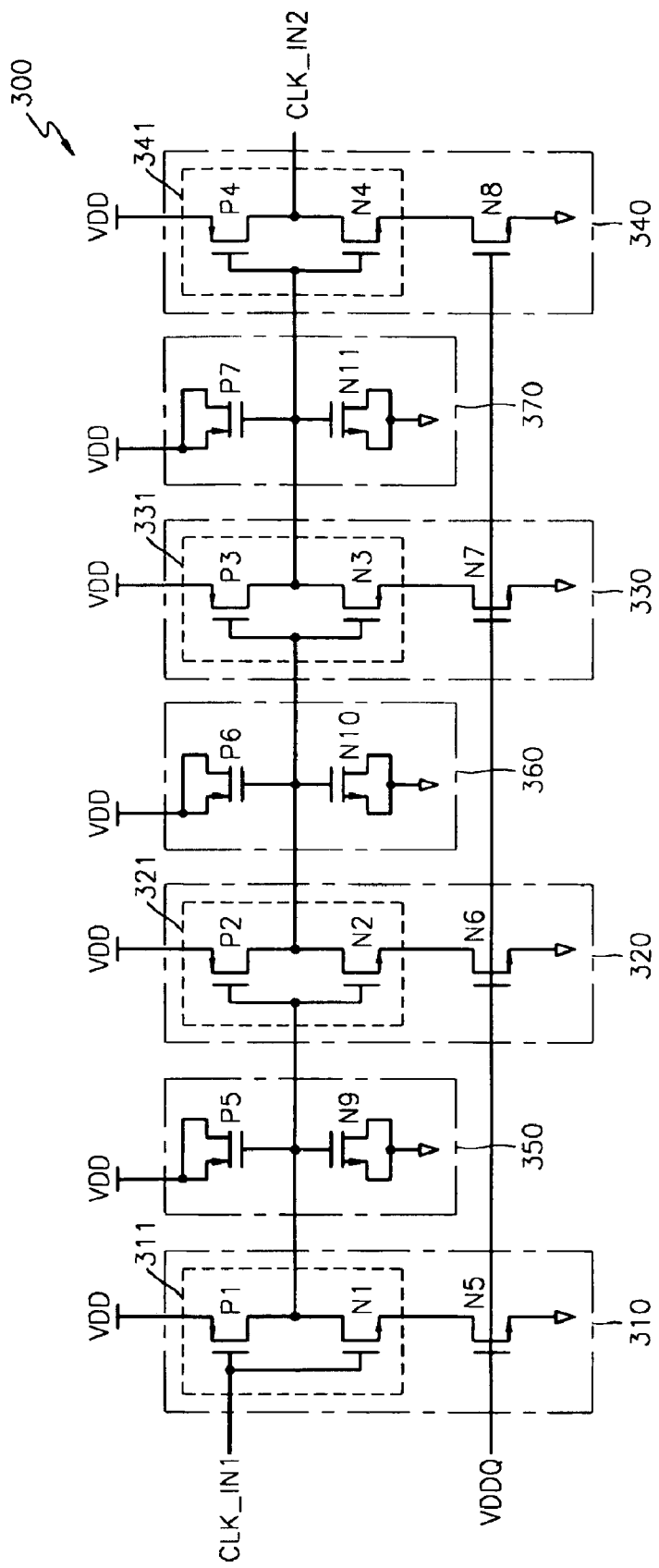
FIG. 8 is a schematic illustration of a compensation delay circuit according to still further embodiments of the present invention.

FIG. 8 is a schematic illustration of a compensation delay circuit 300 according to additional embodiments of the present invention. As shown in FIG. 8, the compensation delay circuit 300 includes a plurality of delay circuits 310, 320, 330 and 340 and a plurality of capacitance circuits 350, 360 and 370. The plurality of capacitance circuits 350, 360 and 370 are respectively connected between the plurality of delay circuits 310, 320, 330 and 340. The plurality of delay circuits 310, 320, 330 and 340 include a plurality of inverter circuits 311, 321, 331 and 341 and a plurality of pull-down circuits N5, N6, N7 and N8. In FIG. 8, four delay circuits are connected with one another. However, the number of delay circuits may vary with respect to a target delay time of the compensation delay circuit.

The configuration and operation of each of delay circuits 310, 320, 330 and 340 are the same as those of the plurality of delay circuits 110, 120, 130 and 140 and thus they will not be described further herein.

The plurality of capacitance circuits 350, 360 and 370 may include PMOS transistors P5, P6 and P7 and NMOS transistors N9, N10 and N11. The capacitance circuit 350 includes the PMOS transistor P5 and the NMOS transistor N9. The gates of the PMOS transistor P5 and the NMOS transistor N9 are connected to an output of the inverter circuit 311 and an input of the inverter circuit 321. The source and drain of the PMOS transistor P5 are connected to the first external voltage VDD. The source and drain of the NMOS transistor N9 are connected to the ground voltage.

The capacitance circuit 360 includes the PMOS transistor P6 and the NMOS transistor N1. The gates of the PMOS transistor P6 and the NMOS transistor N10 are connected to an output of the inverter circuit 321 and an input of the inverter circuit 331. The source and drain of the PMOS transistor P6 are connected to the first external voltage VDD. The source and drain of the NMOS transistor N10 are connected to a ground voltage.

The capacitance circuit 370 includes the PMOS transistor P7 and the NMOS transistor N11. Gates of the PMOS transistor P7 and the NMOS transistor N11 are connected to an output of the inverter circuit 331 and an input of the inverter circuit 341. A source and a drain of the PMOS transistor P7 are connected to the first external voltage VDD. A source and a drain of the NMOS transistor N11 are connected to a ground voltage.

The capacitance circuits 350, 360, and 370 respectively delay the internal clock signal CLK_IN1 delayed by the inverter circuits 311, 321, and 331 and respectively output the delayed internal clock signal CLK_IN1. In FIG. 8, three capacitance circuits are shown. However, the number of capacitance circuits may vary with respect to a target delay time of a compensation delay circuit.

As described above, the delay time of the internal clock signal CLK_IN1 is controlled by the capacitance circuit, and the number of inverter circuits can be reduced by adjusting the number of capacitance circuits to obtain a desired target delay time of a compensation delay circuit 300.

With a DLL of a semiconductor memory device having an improved compensation delay circuit of the present invention, it may be possible to accurately compensate for a data output delay time introduced by a data output driver with respect to a change in a supply voltage of the data output driver. In addition, it may be possible to remove high frequency noise by using a metal line connecting the supply voltage of the data output driver with the compensation delay circuit.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A delay locked loop (DLL) for synchronizing an external clock signal and an internal clock signal, comprising:
   a compensation delay circuit configured to receive a first voltage as an operating voltage and a second voltage as a control signal, to reflect a delay time introduced by a data output buffer, and to delay the internal clock signal for the delay time, wherein the first voltage is a supply voltage of the DLL and the second voltage is a supply voltage of the data output buffer.

2. The DLL of claim 1, wherein the compensation delay circuit includes at least one of a delay circuit having delay time controlled in response to the second voltage.

3. The DLL of claim 2, wherein the delay circuit comprises:
   a first transistor having a source to which the first voltage is applied and a gate to which the internal clock signal is applied;
   a second transistor having a drain connected to the drain of the first transistor and a gate to which the internal clock signal is applied; and
   a third transistor having a drain connected to the source of the second transistor, a gate to which the second voltage is applied, and a source to which a ground voltage is applied.

4. The DLL of claim 3, wherein the first transistor is a PMOS transistor and the second and the third transistors are NMOS transistors.

5. The DLL of claim 2, wherein the delay circuit further includes at least one of a capacitance circuit connected to the delay circuit.

6. The DLL of claim 1, wherein the compensation delay circuit comprises:
a bias circuit configured to generate first and second bias voltages in response to the second voltage; and
at least one of a delay circuit configured to control a delay time in response to the bias voltages.

7. The DLL of claim 6, wherein the bias circuit comprises:
first and second transistors forming a current mirror for generating the first bias voltage, the first and second transistors each having a source to which the first voltage is applied;
a third transistor having a drain connected to a drain of the first transistor for generating of the second bias voltage, a gate to which the second voltage is applied, and a source to which a ground voltage is applied; and
a fourth transistor having a drain and a gate, both of which are connected to a drain of the second transistor, and a source connected to the ground voltage.

8. The DLL of claim 7, wherein the first and second transistors are PMOS transistor and the third and fourth transistors are NMOS transistor.

9. A delay locked loop (DLL), comprising:
a phase detector configured to detect a phase error between an external clock signal and a first internal clock signal and to output a phase error signal;
a variable delay circuit configured to receive the external clock signal and the phase error signal, to delay the external clock signal in response to the phase error signal, and to generate a second internal clock signal; and
a compensation delay circuit configured to receive the second internal clock signal, a first voltage as an operating voltage and a second voltage as a control signal, to reflect a delay time introduced by a data output buffer, and to delay the internal clock signal for the delay time, wherein the first voltage is a supply voltage of the DLL and the second voltage is a supply voltage of the data output buffer.

10. The DLL of claim 9, wherein the compensation delay circuit includes at least one of a delay circuit having a delay time controlled in response to the second voltage.

11. The DLL of claim 10, wherein the delay circuit comprises
a first transistor having a source to which the first voltage is applied and a gate to which the second internal clock signal is applied;
a second transistor having a drain connected to the drain of the first transistor and a gate connected to the second internal clock signal; and
a third transistor having a drain connected to the source of the second transistor, a gate to which the second voltage is applied, and a source to which a ground voltage is applied.

12. The DLL of claim 11, wherein the first transistor is a PMOS transistor and the second and the third transistors are NMOS transistors.

13. The DLL of claim 10, wherein the delay circuit further includes at least one of a capacitance circuit connected to the delay circuit.

14. The DLL of claim 9, wherein the compensation delay circuit comprises:
a bias circuit configured to generate first and second bias voltages in response to the second voltage; and
at least one of a delay circuit configured to control a delay time in response to the first and second bias voltages and the second internal clock signal.

15. The DLL of claim 4, wherein the bias circuit comprises:
first and second transistors forming a current mirror for generating the first bias voltage, the first and second transistors each having a source to which the first voltage is applied;
a third transistor having a drain connected to a drain of the first transistor, a gate to which the second voltage is applied, and a source to which a ground voltage is applied; and
a fourth transistor having a drain and a gate, both of which are connected to a drain of the second transistor, and a source to which the ground voltage is applied.

16. The DLL of claim 15, wherein the first and second transistors are PMOS transistors and the third and fourth transistors are NMOS transistors.

17. The DLL of claim 14, wherein the delay circuit comprises:
a first transistor having a source to which the first voltage is applied and a gate to which the first bias voltage is applied;
a second transistor having a source connected to the drain of the first transistor and a gate to which the second internal clock signal is applied;
a third transistor having a drain connected to the drain of the second transistor and a gate to which the second internal clock signal is applied; and
a fourth transistor having a drain connected to the source of the third transistor, a gate to which the second bias voltage is applied, and a source to which a ground voltage is applied.

18. The DLL of claim 17, wherein the first and second transistors are PMOS transistors and the third and fourth transistors are NMOS transistors.

19. A semiconductor memory device, comprising:
a memory cell array;
a data output circuit configured to output data from the memory cell array; and
a delay locked loop (DLL), comprising:
a phase detector configured to detect a phase error between an external clock signal and a first internal clock signal and to output a phase error signal;
a variable delay circuit configured to receive the external clock signal and the phase error signal, to delay the external clock signal in response to the phase error signal, and to generate a second internal clock signal; and
a compensation delay circuit configured to receive the second internal clock signal, a first voltage as an operating voltage and a second voltage as a control signal, to reflect a delay time introduced by the data output buffer, and to delay the internal clock signal for the delay time, wherein the first voltage is a supply voltage of the DLL and the second voltage is a supply voltage of the data output buffer.

20. The DLL of claim 19, wherein the compensation delay circuit includes at least one of a delay circuit having delay time controlled in response to the second voltage.

* * * * *